(12) United States Patent
Harikrishna Mohan et al.

(10) Patent No.: US 11,205,751 B2
(45) Date of Patent: Dec. 21, 2021

(54) NOZZLE DESIGN FOR ORGANIC VAPOR JET PRINTING

(71) Applicant: Universal Display Corporation, Ewing, NJ (US)

(72) Inventors: Siddharth Harikrishna Mohan, Plainsboro, NJ (US); Paul E. Burrows, Chattaroy, WA (US)

(73) Assignee: Universal Display Corporation, Ewing, NJ (US)

( * ) Notice: Subject to any disclaimer, the term of this patent is extended or adjusted under 35 U.S.C. 154(b) by 398 days.

(21) Appl. No.: 15/723,343

(22) Filed: Oct. 3, 2017

(65) Prior Publication Data

US 2018/0029050 A1 Feb. 1, 2018

Related U.S. Application Data

(62) Division of application No. 13/774,164, filed on Feb. 22, 2013, now abandoned.

(60) Provisional application No. 61/610,056, filed on Mar. 13, 2012.

(51) Int. Cl.
*B05B 1/34* (2006.01)
*H01L 51/00* (2006.01)
*H01L 51/56* (2006.01)

(52) U.S. Cl.
CPC ........ *H01L 51/0008* (2013.01); *B05B 1/3402* (2018.08); *H01L 51/56* (2013.01)

(58) Field of Classification Search
CPC ............................ H01L 51/0008; H01L 51/56
See application file for complete search history.

(56) References Cited

U.S. PATENT DOCUMENTS

| | | | |
|---|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |

(Continued)

FOREIGN PATENT DOCUMENTS

| | | |
|---|---|---|
| WO | WO-2008057394 A1 | 5/2008 |
| WO | WO-2010011390 A2 | 1/2010 |

OTHER PUBLICATIONS

"Diameter, n.". OED Online. Jun. 2016. Oxford University Press. http://www.oed.com/view/Entry/51945?isAdvanced=false&result=2&rskey=DW424T& (accessed Aug. 27, 2016).

(Continued)

*Primary Examiner* — Nathan T Leong
(74) *Attorney, Agent, or Firm* — Butzel Long

(57) ABSTRACT

Nozzle designs which have been found to be effective in governing overspray in OVJP are provided. Aspects of the invention have been found to be effective in reducing or avoiding sudden pressure drops at the end of the nozzle close to the substrate, and may be advantageously employed in obtaining, for example, greater consistency between the nozzle outlet diameter and the deposited pattern width.

16 Claims, 12 Drawing Sheets

(56) References Cited

U.S. PATENT DOCUMENTS

| | | | |
|---|---|---|---|
| 6,337,102 B1 * | 1/2002 | Forrest | C23C 14/12 |
| | | | 427/64 |
| 6,454,860 B2 * | 9/2002 | Metzner | C23C 16/407 |
| | | | 118/715 |
| 6,468,819 B1 | 10/2002 | Kim et al. | |
| 6,565,661 B1 | 5/2003 | Nguyen | |
| 7,279,704 B2 | 10/2007 | Walters et al. | |
| 7,431,968 B1 | 10/2008 | Shtein et al. | |
| 7,807,222 B2 | 10/2010 | Kuznetsov | |
| 7,968,146 B2 | 6/2011 | Wagner et al. | |
| 2001/0035128 A1 | 11/2001 | Christen | |
| 2003/0209323 A1 | 11/2003 | Yokogaki | |
| 2003/0230980 A1 | 12/2003 | Forrest et al. | |
| 2004/0174116 A1 | 9/2004 | Lu et al. | |
| 2004/0206305 A1 | 10/2004 | Choi et al. | |
| 2005/0126484 A1 * | 6/2005 | Zhao | C23C 16/45565 |
| | | | 118/715 |
| 2005/0255257 A1 | 11/2005 | Choi et al. | |
| 2006/0086463 A1 | 4/2006 | Matsubara et al. | |
| 2006/0228496 A1 | 10/2006 | Choi et al. | |
| 2007/0256786 A1 | 11/2007 | Zhou et al. | |

OTHER PUBLICATIONS

Baldo, et al., "Highly efficient phosphorescent emission from organic electroluminescent devices", Nature, vol. 395, pp. 151-154, Sep. 10, 1998.

Baldo, et al., "Very high-efficiency green organic light-emitting devices based on electrophosphorescence", Applied Physics Letters, vol. 75, No. 1, pp. 4-6, Jul. 5, 1999.

\* cited by examiner

NOZZLE DESIGN FOR ORGANIC VAPOR JET PRINTING

FIELD OF THE INVENTION

The present invention relates to the deposition of organic materials through a nozzle.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

Organic vapor jet printing (OVJP) deposits a patterned organic thin film without the need for a shadow mask by transporting organic vapor in a carrier gas and ejecting it through a nozzle onto a substrate. The aim is to form an organic thin film pattern on the substrate that is substantially limited to the width of the nozzle. Overspray is defined as the percentage of the thickness of the deposited line that gets deposited on other parts of the substrate. For example, a three color display printed using OVJP might contain red, blue and green pixels that each require a separate material deposited from one or more nozzles. It is important that, for example, red light emitting material deposited from one nozzle does not stick to the same region of the substrate as blue light emitting material deposited from a different nozzle.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

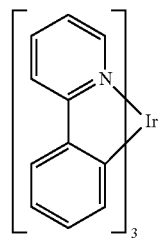

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

The present subject matter is generally directed to nozzle designs, which have been found to be effective in governing overspray in OVJP. It has been found that, in OVJP deposition, sudden pressure drops at the end of the nozzle close to the substrate may create a shock front, which may cause the molecular beam to diverge out from the nozzle and increase overspray. Aspects of the invention have been found to be effective in reducing or avoiding such sudden pressure drops at the end of the nozzle close to the substrate, and may be advantageously employed in obtaining, for example, greater consistency between the nozzle outlet diameter and the deposited pattern width.

In order to minimize undesirable overspray, one object of the invention is to form a more collimated jet within the nozzle. When OVJP is done at vacuum conditions, the ratio of upstream pressure to downstream pressure may be, for example, less than 0.528. This corresponds to 'choked' flow regime, that is, any further increase in the upstream pressure does not change the velocity of the jet in this regime.

According to first aspects of the invention, methods of depositing an organic material may include introducing a vapor including the organic material into a nozzle via an inlet. Embodiments may include ejecting the vapor from an outlet at a distal end of the nozzle, the outlet having a cross sectional area $A1$. After the ejecting, the organic material may be deposited on a substrate to form at least part of an organic emitting or detecting area. In embodiments, the vapor may be passed through a portion of the nozzle (sometimes referred to as a "throttle") between the inlet and the outlet at an axial distance $L1$ from the outlet. In embodiments, the portion of the nozzle may have a cross sectional area $A2$, and $A1/A2$ may be, for example, approximately 16 or greater.

In embodiments, the outlet may have a radius $R1$ and the portion of the nozzle may have a radius $R2$.

As used herein, a "radius" of variously described inlets, outlets, and other nozzle portions is not limited to circular cross sections, and may be broadly understood to include a segment extending from the geometric center, or centroid, of the local cross section to a point on the perimeter of the cross section. Particular radii may be further specified to be, for example, a maximum or minimum radius of the cross sectional shape.

In embodiments, $L1/R2$ may be, for example, in a range of approximately 3 to 200, or approximately 5 to 20.

In embodiments, $R1/R2$ may be, for example, in a range of approximately 4 to 100.

In embodiments, a ratio $A1/A2$ may be, for example, in a range of approximately 16-200, in a range of approximately 50-200, in a range of approximately 16-100, or may be approximately 16.

In embodiments, $A1$ may be, for example, approximately $0.6$-$1.2$ $mm^2$ and $A2$ may be, for example, approximately $0.04$-$0.1$ $mm^2$.

In embodiments, a shock front of the vapor may be formed downstream of the vapor passing through said portion of the nozzle. The shock front of the vapor may be substantially dissipated prior to the outlet.

In embodiments, the vapor may be formed into a collimated beam downstream of said portion of the nozzle and upstream of said outlet.

In embodiments, the nozzle may be included in a nozzle block with a plurality of similar nozzles, and each of the plurality of nozzles may be configured to deposit an organic emitting material. In embodiments, a plurality of nozzles may be provided that deposit a plurality of different organic materials.

In embodiments, a width of the deposited organic material may be substantially equal to a width of the outlet.

In embodiments, the organic material may be deposited without the use of a shadow mask.

According to further aspects of the invention, an organic material depositing device may be provided including an organic material supply, a carrier gas supply, and a nozzle in fluid communication with the organic material supply and the carrier gas supply. In embodiments, the nozzle may include an inlet, and an outlet at a distal end of the nozzle. In embodiments, the device may be configured such that a vapor mixture of the carrier gas and the organic material may be passed through the nozzle, and the organic material deposited on a substrate after exiting the outlet.

In embodiments, the outlet of the nozzle may include a cross sectional area $A1$ and a diameter $D1$. Embodiments may include a portion of the nozzle between the inlet and the outlet at an axial distance $L1$ from the outlet, the portion of the nozzle including a cross sectional area $A2$ and a diameter $D2$.

As used herein, a "diameter" of variously described inlets, outlets, and other nozzle portions is not limited to circular cross sections, and may be broadly understood to include a segment passing through the geometric center, or centroid, of the local cross section, including, for example, spanning distances of circular and non-circular shapes. The use of diameter may be further specified to be, for example, a maximum or minimum diameter of the cross sectional shape.

In embodiments, $A2$ may be less than $A1$. In embodiments, $L1/D2$ may be, for example, greater than 2, or in a range of approximately 2 to 20.

In embodiments, $D1/D2$ may be, for example, in a range of approximately 4 to 100, or in a range of approximately 10 to 100.

In embodiments, a ratio $A1/A2$ may be, for example, in a range of approximately 16-200, in a range of approximately 50-200, in a range of approximately 16-100, or may be approximately 16.

In embodiments, $A1$ may be, for example, approximately $0.6$-$1.2$ $mm^2$ and $A2$ may be, for example, approximately $0.04$-$0.1$ $mm^2$.

In embodiments, the portion of the nozzle may include an axial length $L2$ with a substantially constant cross sectional area. In embodiments, $L2$ may be, for example, less than 1 mm, less than 5 mm, or in a range of 1 mm to 5 mm. In embodiments, the inlet may have a radius R3. In embodiments, L2/R3 may be in a range of approximately 1 to 10.

In embodiments, the outlet may include an axial length L1 in which the vapor mixture may be collimated. In embodiments, L1 may be, for example, greater than 1 mm, greater than 5 mm, in a range of 1 mm to 10 mm, in a range of 5 mm to 10 mm, in a range of 1 mm to 20 mm, or in a range of 5 mm to 20 mm.

In embodiments, the device may be configured such that, in use, a shock front of the vapor may be formed upon the vapor passing through said portion of the nozzle and substantially dissipate prior to the outlet.

In embodiments, the nozzle may be included in a nozzle block with a plurality of similar nozzles, each of the plurality of nozzles configured to deposit an organic emitting material.

In embodiments, at least three different organic material supplies containing different organic emitting materials may be connected to different nozzles.

In embodiments, a plurality of nozzles may be arranged in a line.

In embodiments, a plurality of nozzles may be arranged in a two dimensional array.

In embodiments, the nozzle may be a first nozzle included in a print head. In embodiments, the print head may have a thickness in a range of, for example, 5 mm to 25 mm. The first nozzle may be in fluid communication with a first source of gas.

The print head may include a plurality of first nozzles. The plurality of nozzles may be in fluid communication with the first source of gas.

The print head may include a second nozzle in fluid communication with a second source of gas different from the first source of gas.

The print head may include a third nozzle in fluid communication with a third source of gas different from the first and second sources of gas.

The print head may comprise a plurality of first nozzles in fluid communication with the first source of gas, a plurality of second nozzles in fluid communication with the second source of gas, and/or a plurality of third nozzles in fluid communication with the third source of gas.

The nozzle may be formed from a variety of materials, such as, for example, silicon, metals, ceramics and combinations thereof. In embodiments, the inlet, outlet and/or portion of the nozzle may be manufactured from a layer of material different than each other.

In embodiments, the device may be used with gas streams that may carry multiple organic materials in each gas stream.

A gas source, such as the first gas source or any other gas source may include multiple organic sources. Multiple vias connected to different gas sources may be in fluid communication with the same nozzle, resulting in a mix of gases in the nozzle.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification; illustrate embodiments of the invention and together with the detailed description serve to explain the principles of the invention. No attempt is made to show structural details of the invention in more detail than may be necessary for a fundamental understanding of the invention and various ways in which it may be practiced.

DETAILED DESCRIPTION

Figure 1:
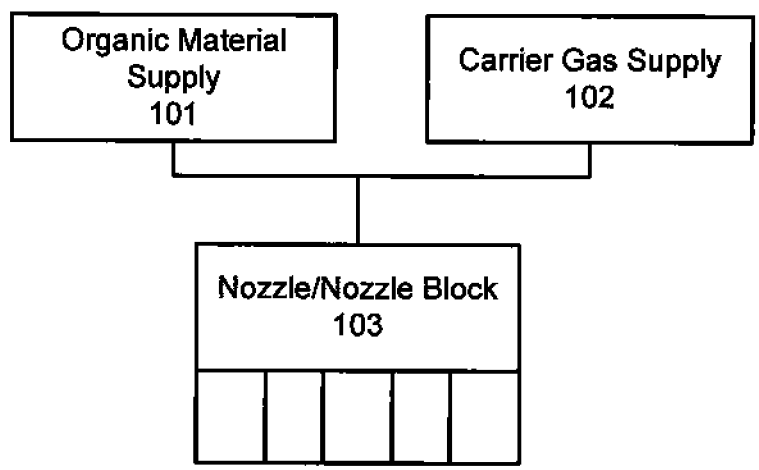
FIG. 1 is a schematic illustration of an exemplary deposition system according to aspects of the invention.

It is understood that the invention is not limited to the particular embodiments described herein, as these may vary as the skilled artisan will recognize. It is also to be understood that the terminology used herein is used for the purpose of describing particular embodiments only, and is not intended to limit the scope of the invention. It also is to be noted that as used herein and in the appended claims, the singular forms "a," "an," and "the" include the plural reference unless the context clearly dictates otherwise. Thus, for example, a reference to "a nozzle" is a reference to one or more nozzles and equivalents thereof known to those skilled in the art.

Unless defined otherwise, all technical terms used herein have the same meanings as commonly understood by one of ordinary skill in the art to which the invention pertains. The embodiments of the invention and the various features and advantageous details thereof are explained more fully with reference to the non-limiting embodiments and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein.

Any numerical values recited herein include all values from the lower value to the upper value in increments of one unit provided that there is a separation of at least two units between any lower value and any higher value. As an example, if it is stated that the concentration of a component or value of a process variable such as, for example, size, angle size, pressure, time and the like, is, for example, from 1 to 100, from 1 to 50, or from 5 to 20, it is intended that values included therein are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

In the present subject matter, a nozzle configuration may be implemented to, for example, reduce overspray of a deposited material. As schematically shown in FIG. 1, an exemplary organic material depositing device may generally include an organic material supply 101, a carrier gas supply 102, and a nozzle/nozzle block 103, or other nozzle structure, including one or more nozzles in fluid communication with the organic material supply and the carrier gas supply. The specifics of such connections, and the related architecture, may vary as known by those of skill in the art and are not described in detail here.

In embodiments, nozzle block 103 may include a plurality of similar nozzles, each of the plurality of nozzles configured to deposit an organic emitting material. For example, at least three different organic material supplies 101 containing different organic emitting materials may be connected to different nozzles in nozzle block 103, which may be preferable, for example, in forming displays or lighting panels with different color emitting pixels or regions.

Nozzle block 103 may include the plurality of nozzles arranged in a line and/or in a two dimensional array. In embodiments, the nozzle(s) may be included in a print head. The print head may have a thickness in a range of, for example, 5 mm to 25 mm.

The print head may comprise a plurality of first nozzles in fluid communication with a first source of gas, a plurality of second nozzles in fluid communication with a second source of gas, and/or a plurality of third nozzles in fluid communication with a third source of gas.

The nozzle(s) included in nozzle block 103 may be formed from a variety of materials, such as, for example, silicon, metals, ceramics and combinations thereof. In embodiments, the inlet, outlet and/or portion of the nozzle may be manufactured from a layer of material different than each other.

A source, such as the organic material supply 101, may include multiple organic sources. Multiple vias connected to different gas sources may be in fluid communication with the same nozzle, resulting in a mix of gases in the nozzle. Further details of an exemplary nozzle according to aspects of the invention are shown in FIG. 2.

Figure 2:
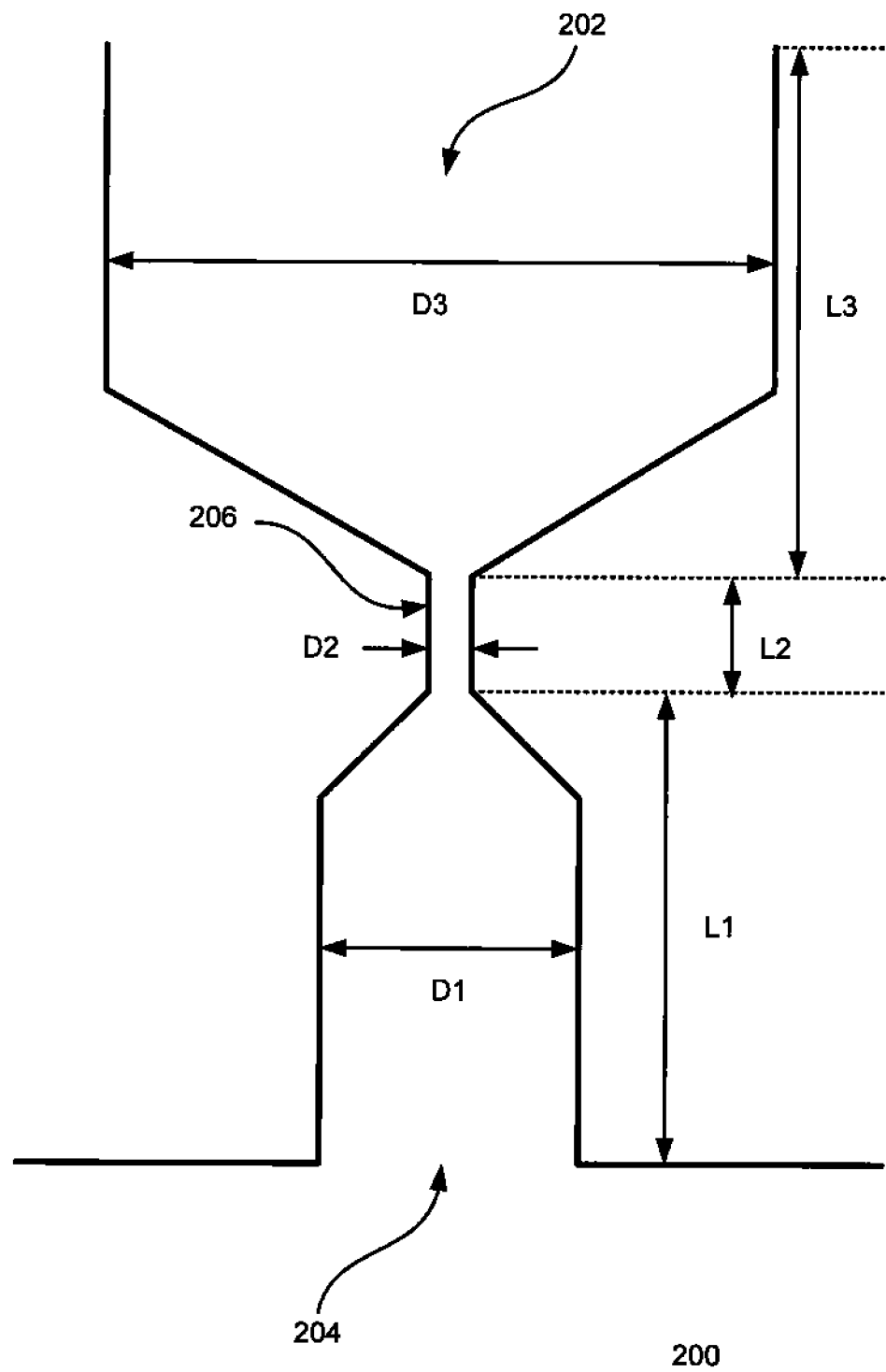
FIG. 2 shows an exemplary nozzle with relevant dimensions according to aspects of the invention.

As shown in FIG. 2, an exemplary nozzle 200 may include an inlet 202, and an outlet 204 at a distal end of the nozzle. The nozzle 200 may be included, for example, in a device configured such that a vapor mixture of a carrier gas and an organic material may be passed through the nozzle 200, and the organic material deposited on a substrate (not shown) after exiting the outlet 204.

The outlet 204 of the nozzle may include a cross sectional area A1 (not shown) and a diameter D1. The nozzle 200 may include a portion 206, which may be referred to as a "throttle," between the inlet 202 and the outlet 204 at an axial distance L1 from the outlet 204. The throttle portion 206 may include a cross sectional area A2 (not shown) and a diameter D2.

As mentioned above, a "diameter" of variously described inlets, outlets, and other nozzle portions is not limited to circular cross sections, and may be broadly understood to include a segment passing through the geometric center, or centroid, of the local cross section. In the embodiment shown in FIG. 2, D1 represents a maximum diameter of the outlet and D2 represents a minimum diameter of the portion 206. Outlet 204 may also include a radius R1 that is half of D1, and throttle portion 206 may include a radius R2 that is half of D2.

Figure 3A:
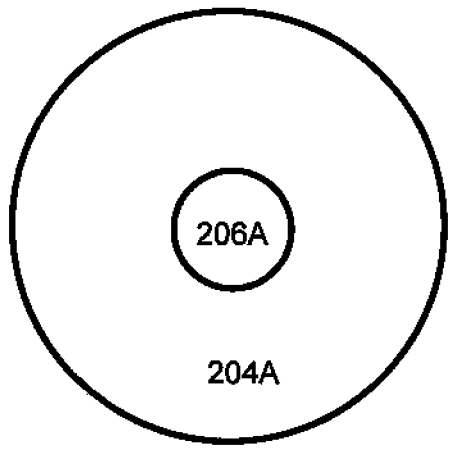
FIGS. 3A-3D depict various cross sectional views of throttle portions and corresponding outlets according to aspects of the invention.
Figure 3B:
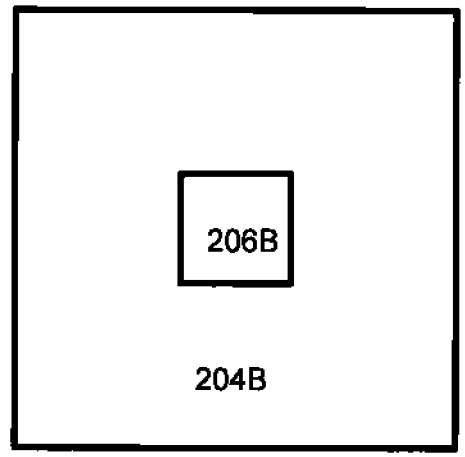
Figure 3C:
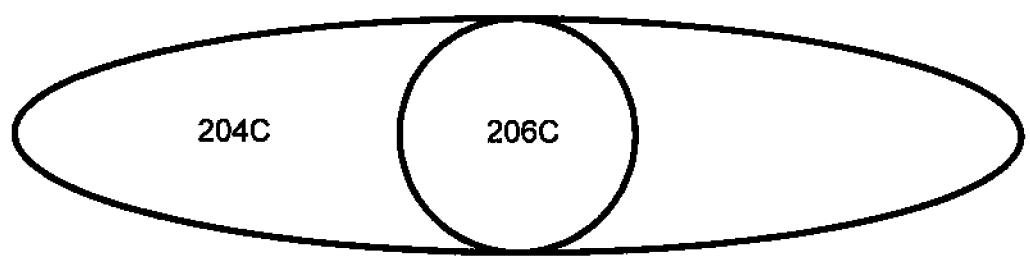
Figure 3D:
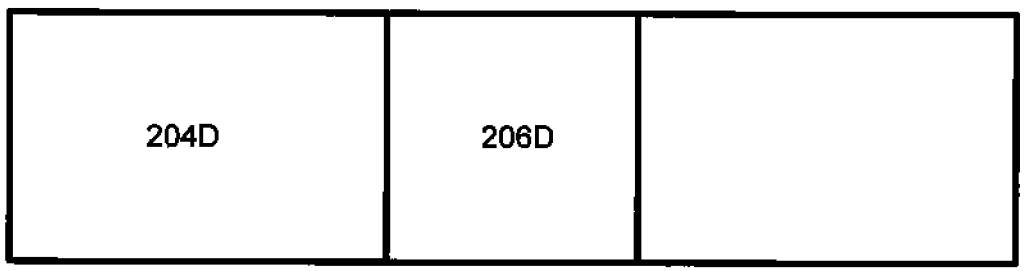

Various cross sectional shapes are possible with respect to the throttle portion 206 and outlet 204. For example, as shown in FIGS. 3A and 3B, the throttle and outlet may have similar shapes with the outlet being larger than the throttle. FIG. 3A shows a circular outlet 204A with a smaller diameter circular throttle 206A. FIG. 3B shows a square outlet 204B with a smaller diameter square throttle 206B. In other embodiments, such as shown in FIGS. 3C and 3D, the outlet and throttle may have different shapes. FIG. 3C shows an oval-shaped outlet 204C with a smaller area circular throttle 206C. Of note, in embodiments such as shown in FIG. 3C, the outlet may have a larger area than the throttle even when the throttle and the outlet have substantially equal minimum diameters. Another possible example is shown in FIG. 3D, which includes a rectangular-shaped outlet 204D with a smaller area square throttle 206D.

Thus, as will be appreciated in considering FIG. 2 and the exemplary embodiments shown in FIGS. 3A-3D, in embodiments, the cross sectional area (A2) of the throttle portion may be less than the cross sectional area (A1) of the outlet. In embodiments, a ratio A1/A2 may be, for example, in a range of approximately 16-200, in a range of approximately 50-200, in a range of approximately 16-100, or may be approximately 16. Such ratios may be advantageous, along with others described herein, in allowing the shock front of the jet to form within the nozzle after exiting the throttle.

In embodiments, A1 may be, for example, approximately 0.6-1.2 mm$^2$ and A2 may be, for example, approximately 0.04-0.1 mm$^2$.

The inventors have similarly found that it may be advantageous to scale the relative diameters of the outlet and the nozzle. For example, returning to FIG. 2, in embodiments, D1/D2 may be, for example, greater than 4, in a range of approximately 4 to 100, or in a range of approximately 10 to 100.

As described further below, it may also be beneficial to provide sufficient distance for the shock front of the jet to form and substantially dissipate prior to the jet exiting the outlet 204. Thus, in embodiments, L1/D2 may be, for example, greater than 2. That is, embodiments may include configurations in which the distance between the outlet and the throttle portion in the flow direction is greater than twice the diameter of the throttle. In embodiments, L1/D2 may be, for example, preferably in a range of approximately 2 to 20. This is a departure from known OVJP systems that typically teach the "aperture" (i.e. the most constricted portion) of the nozzle being as close as possible to the substrate, e.g. on the order of micrometers.

In embodiments, such as that shown in FIG. 2, the throttle portion 206 of the nozzle may include an axial length L2 with a substantially constant cross sectional area. L2 may be, for example, less than 1 mm, less than 5 mm, or in a range of 1 mm to 5 mm. However, it is also possible for throttle portions to include a minimal or de minimis L2, or a length with varying cross sectional areas. In such situations, L1 may be measured, for example, from the outlet to a minimum throttle cross section.

The inlet 202 may take various forms, and may include bounded areas with diameter D3 (or R3 equal to one half of D3) and/or axial length L3, such as shown in FIG. 2, or relatively unbounded areas where the diameter and/or length of the inlet tube/chamber greatly exceeds the scale of the individual throttle(s). In certain embodiments, L2/R3 may be in a range of approximately 1 to 10.

In embodiments, the outlet may include an axial length L1 in which the vapor mixture may be collimated. In embodiments, at least part of, most of, or all of, the outlet along L1 may include a substantially constant cross sectional area. In embodiments, L1 may be, for example, greater than 1 mm, greater than 5 mm, in a range of 1 mm to 10 mm, in a range of 5 mm to 10 mm, in a range of 1 mm to 20 mm, or in a range of 5 mm to 20 mm.

Figure 4:
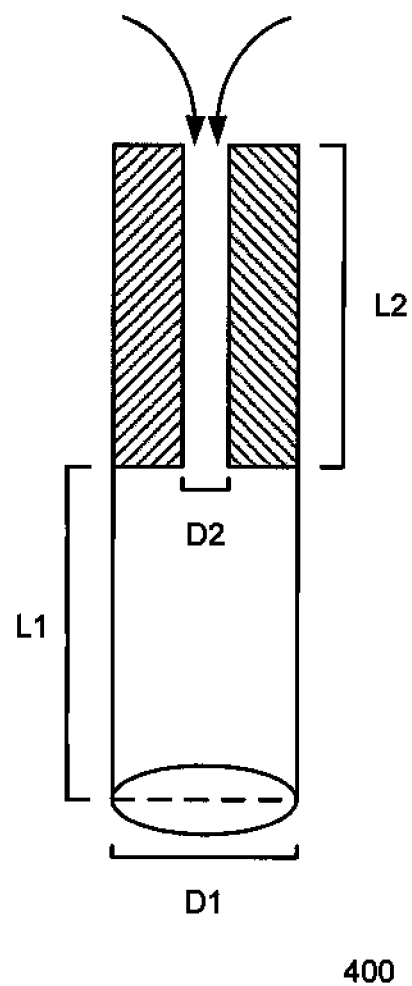
FIG. 4 shows another exemplary nozzle with relevant dimensions according to aspects of the invention.
Figure 5:
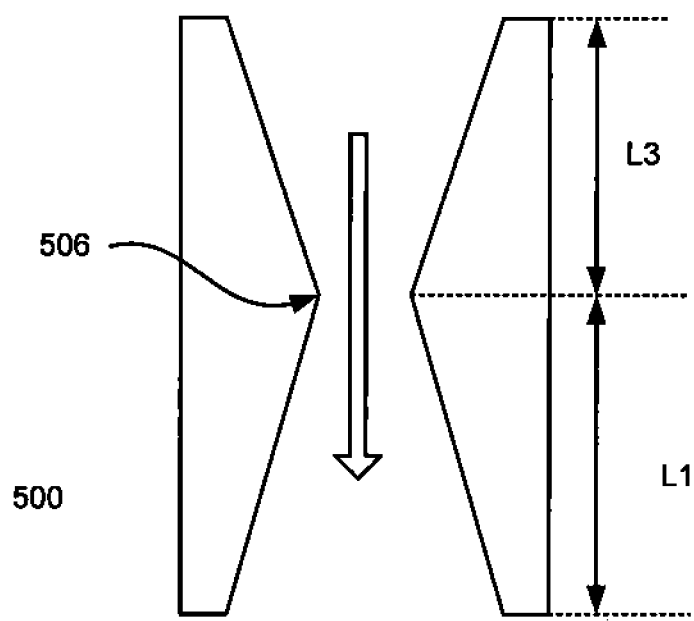
FIG. 5 shows an exemplary convergent-divergent nozzle with relevant dimensions according to aspects of the invention.
Figure 6:
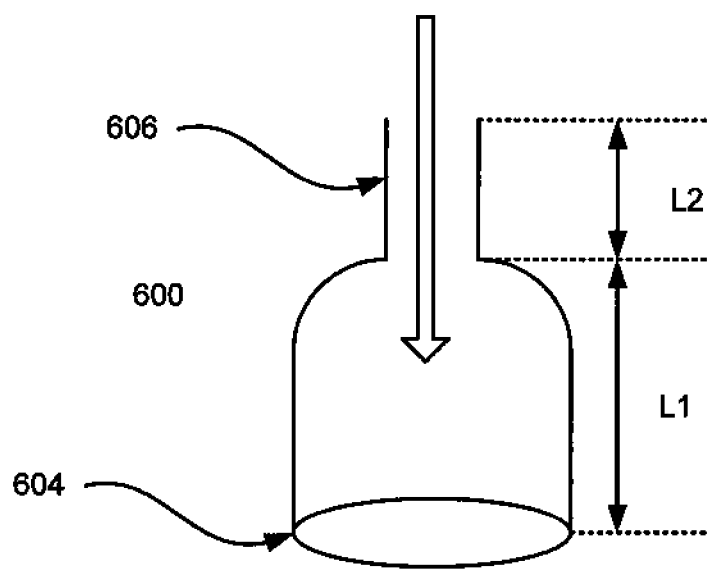
FIG. 6 shows yet another exemplary nozzle including a rounded transition between the throttle portion and the outlet according to aspects of the invention.

A similar design is shown in FIG. 4, which depicts an outlet with a substantially uniform cross section throughout the length L1, and a relatively unbounded inlet. Such configurations may be conveniently formed, for example, by joining plates of similar or different materials, including separately formed apertures, together. FIGS. 5 and 6 show additional alternative designs.

As shown in FIG. 5, a nozzle 500 may be configured with a converging inlet along L3 and a diverging outlet along L1, thus including a throttle portion 506 with de minimis axial length. As shown in FIG. 6, a nozzle 600 may be configured such that the transition between the cross sectional area of the throttle portion 606 and the outlet 604 may be rounded, which may be advantageous, for example, in tuning the shock front and jet collimation, and/or in certain fabrication techniques.

As shown in FIGS. 2 and 4-6, according to aspects of the invention, the throttle of the nozzle is located within the body of the nozzle at a distance L1 away from nozzle outlet, which is relatively large compared to the diameter of the throttle. In use, the organic vapor jet initially converges at the throttle where the cross sectional area is minimum, is accelerated, and then expands to (ideally) form a collimated beam. The inventors have found that overspray may be significantly reduced by using such a nozzle design compared to a converging or straight nozzle.

As discussed further below, experimental data derived by the inventors has suggested that, for example, preferable design conditions for beam collimation in OVJP include increasing the A1/A2 ratio (e.g. between 16-200), and reducing L2, which can increase the gas conductance.

The inventors have further found that, by employing such nozzle design parameters, under conditions used for OVJP deposition, a shock front of the vapor may be formed upon the vapor passing through the throttle portion of the nozzle, and that the shock front can be substantially dissipated prior to the outlet. Evidence of the shock front dissipation can be seen, for example, in reduced overspray and better deposition resolution compared to patterns achieved by converging or straight nozzles.

Figure 7:
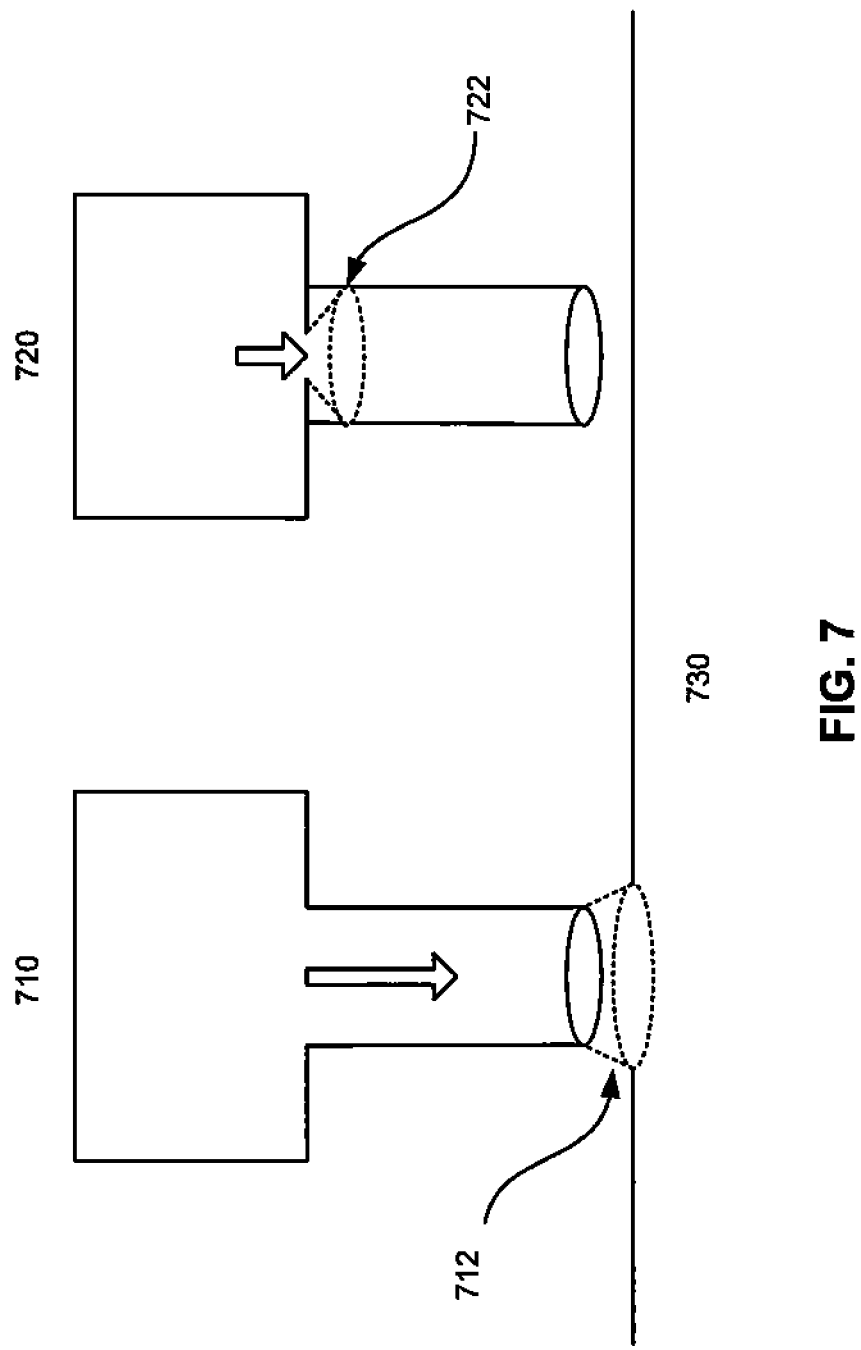
FIG. 7 the shock front regions in a straight nozzle (left), and in a nozzle according to aspects of the invention (right)

FIG. 7 shows a comparison of the operation of a conventional straight nozzle 710 to an exemplary nozzle 720 according to aspects of the invention. In the nozzle 720, the smallest aperture/throat is located well within the body of the nozzle, further away from nozzle tip, whereas the aperture is located at the nozzle tip in a straight nozzle 710. Thus in straight nozzle 710, a sudden pressure drop occurs at the end of the nozzle close to the substrate 730, and this creates a shock front 712 which may cause the molecular beam to diverge out from the nozzle and increase overspray. However, in the nozzle 720, the shock front 722 is moved far away from the substrate 730, well within the nozzle. This greatly reduces the divergence of the beam and hence the overspray.

As mentioned previously, aspects of the present invention may find particular relevance in the field of OVJP deposition of organic emitting and/or detecting devices. Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

An OLED may include, for example, a substrate, an anode, a hole injection layer, a hole transport layer, an electron blocking layer, an emissive layer, a hole blocking layer, an electron transport layer, an electron injection layer, a protective layer, and a cathode. Such OLEDs may be fabricated by depositing the layers described, in order. The properties and functions of these various layers, as well as example materials, are described in more detail in U.S. Pat. No. 7,279,704 at cols. 6-10, which are incorporated by reference.

Figure 8:
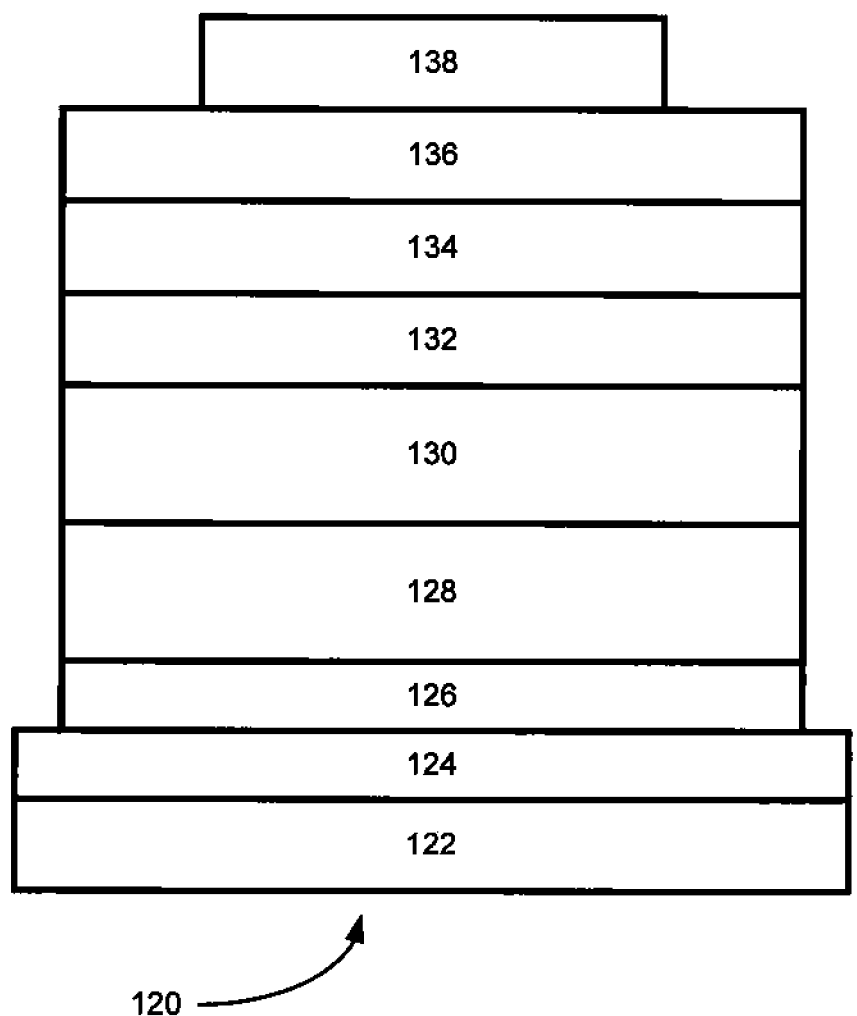
FIG. 8 is a schematic of an exemplary organic light emitting stack.

According to embodiments, lighting panels, displays and/or detectors may be provided with an OLED stack. As shown in FIG. 8, an exemplary OLED device stack 120 may include a plurality of material layers 122-136. OLEDs may be fabricated on a glass substrate 122, and include, in order, an anode 124 (1200 Å thick ITO), a hole injection layer 126 (100 Å thick LG101, available from LG Chemicals of Korea), a hole transport layer 128 (450 Å thick NPD), a first emissive layer 130 (200 Å thick Host B doped with 30% Green Dopant A and 0.6% Red Dopant A), a second emissive layer 132 (75 Å thick Blue Host A doped with 25% Blue Dopant A), a blocking layer 134 (50 Å thick Blue Host A), a layer 136 (250 Å thick layer of 40% LG201, available from LG Chemicals of Korea and 60% LiQ), and a cathode 138 (10 Å thick layer of LiQ (lithium quinolate) and a 1000 Å thick layer of Al). The foregoing materials and dimensions are provided merely by way of example, and should not be interpreted as limiting the scope of the invention. Other configurations for the OLED are also contemplated and will be appreciated by those of skill in the art.

Some examples of the OLED materials that may be used to form the device stack 200 are shown below.

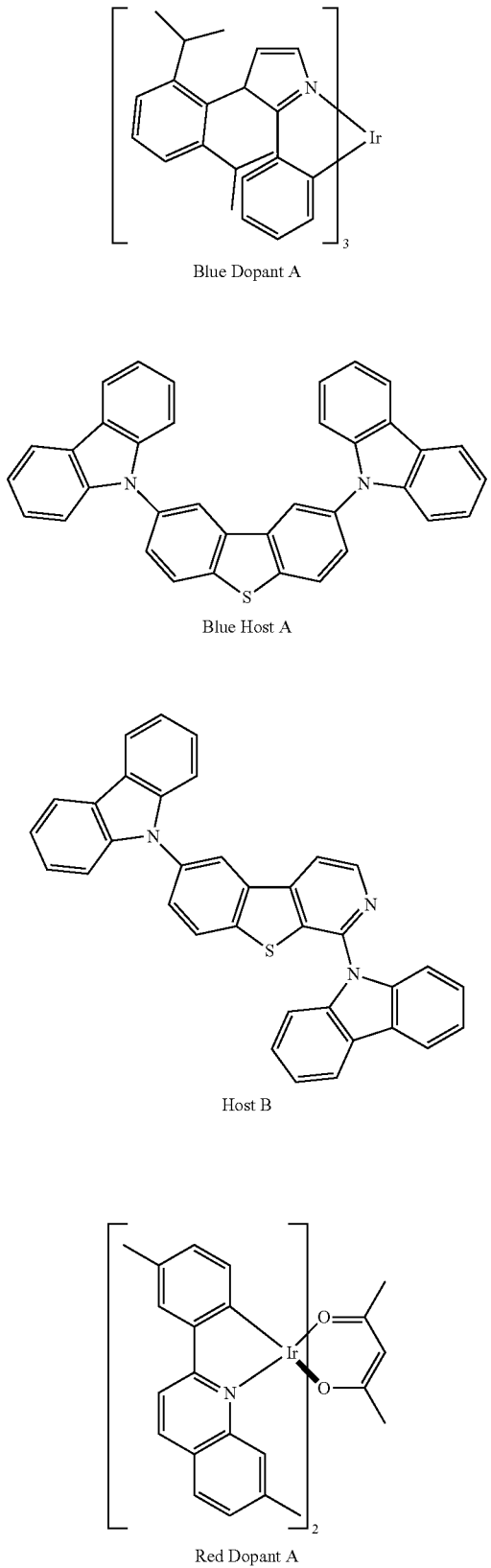

Blue Dopant A

Blue Host A

Host B

Red Dopant A

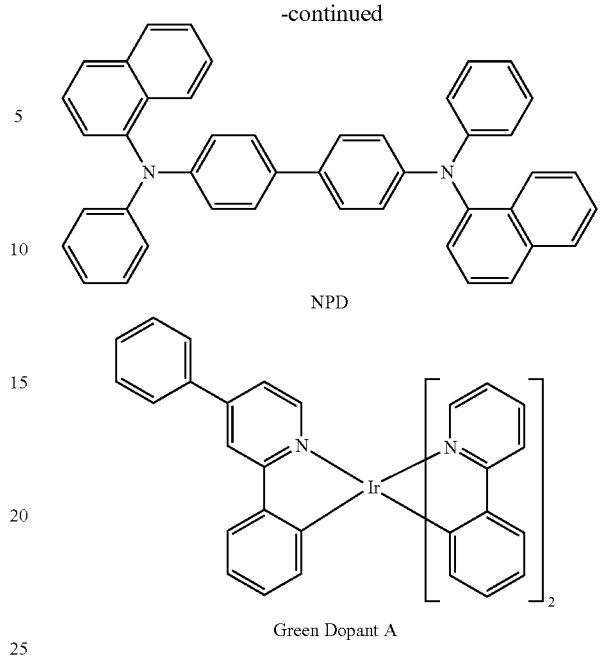

NPD

Green Dopant A

An OLED device, such as shown in FIG. 8, may be incorporated in an OLED panel or, on a smaller scale, in an OLED display.

According to aspects of the invention, it may be desirable to deposit one or more of the organic layers using the techniques described herein in order to obtain a patterned layer including one or more strips of deposited material, such as when the nozzle and/or the substrate are moved relative to one another. As mentioned previously, a plurality of nozzles may be used, each nozzle depositing a different organic material, to form multiple strips of different organic emitters.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The simple layered structure discussed above is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, a hole transport layer may transport holes and inject holes into emissive layer, and may be described as a hole transport layer or a hole injection layer. In embodiments, an OLED may be described as having an "organic layer" disposed between a cathode and an anode. This organic layer may comprise a single layer, or may further comprise multiple layers of different organic materials.

Structures and materials not specifically described may also be used, such as OLEDs comprised of polymeric materials (PLEDs) such as disclosed in U.S. Pat. No. 5,247, 190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

EXPERIMENTAL

Figure 9:
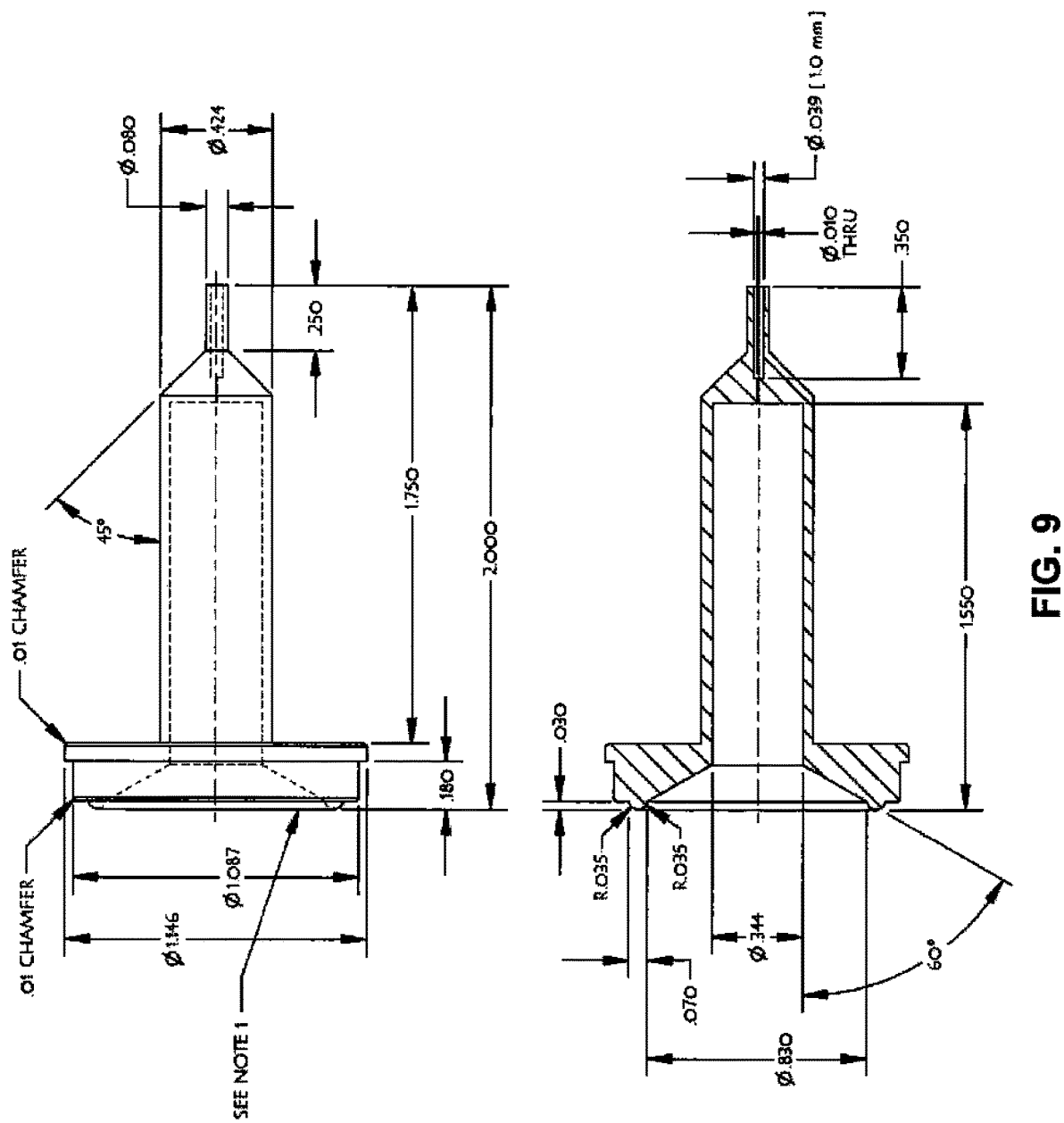
FIG. 9 shows an OVJP nozzle according to aspects of the invention.
Figure 10:
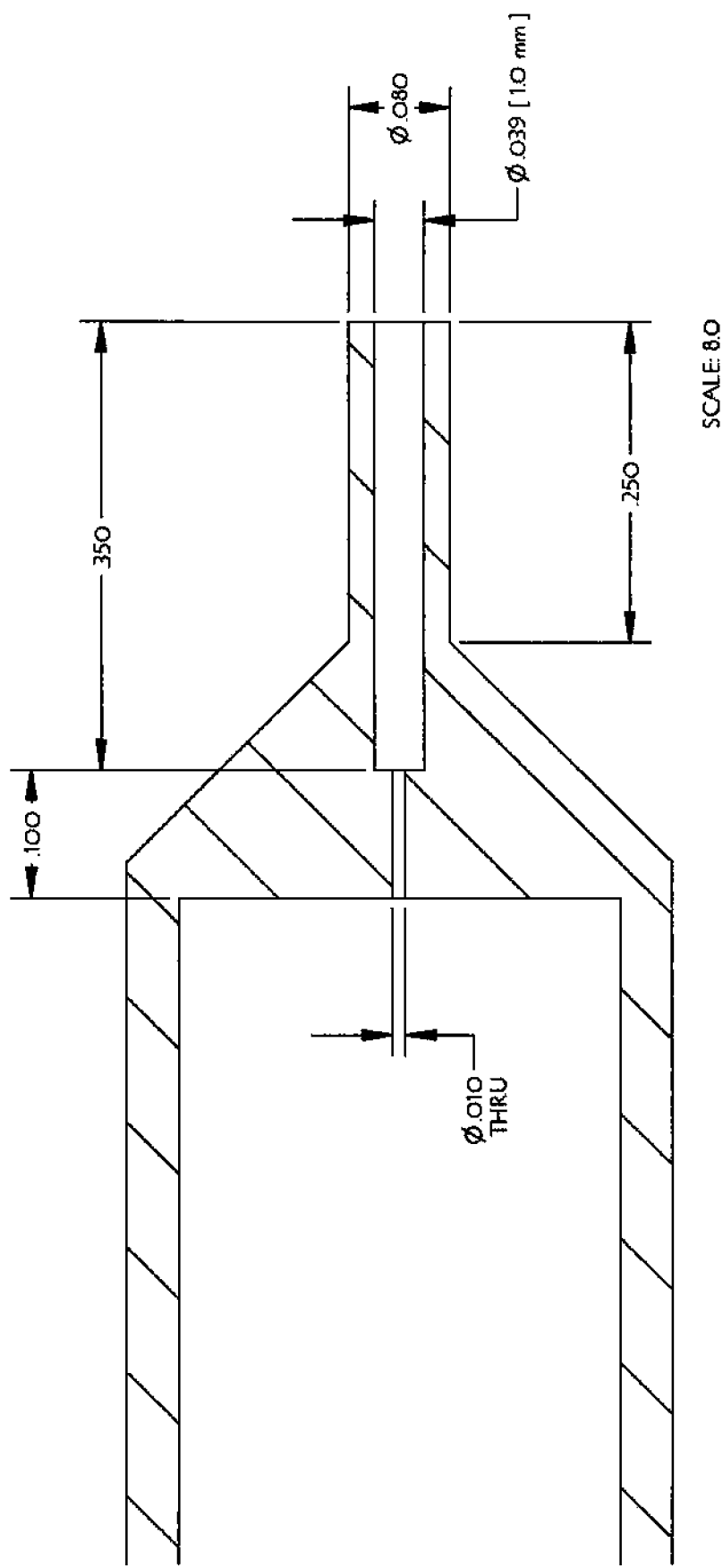
FIG. 10 shows further details of OVJP nozzle tip according to aspects of the invention.
Figure 11:
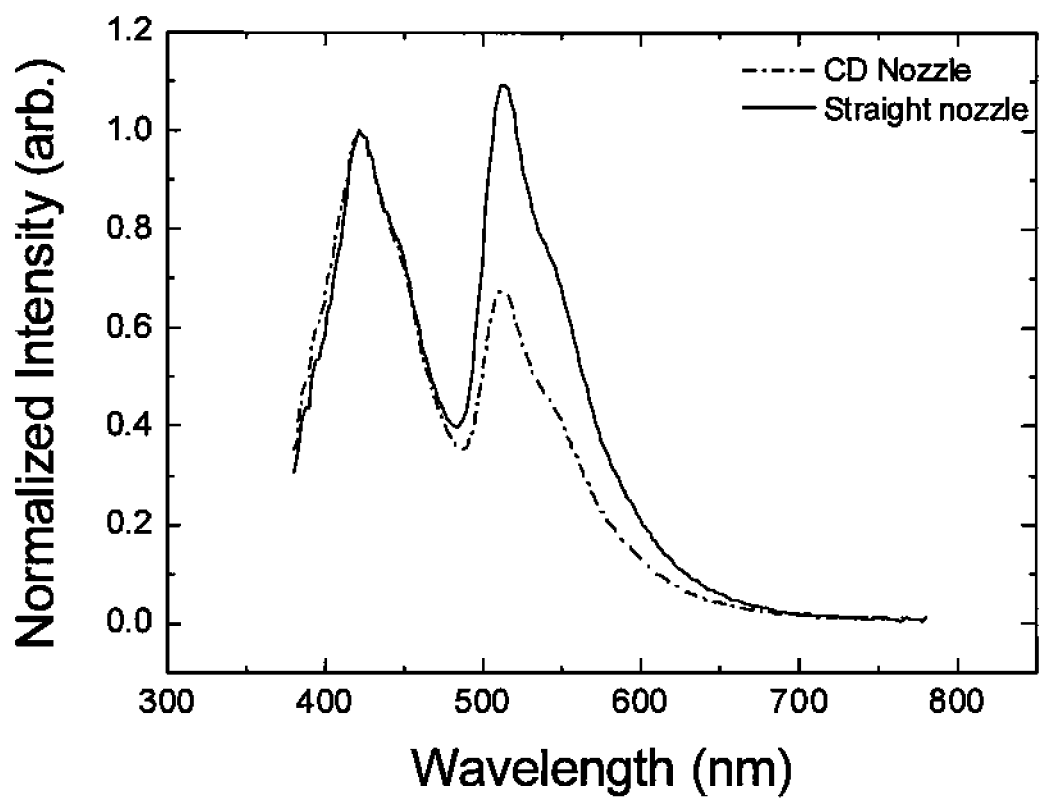
FIG. 11 shows a plot of normalized emission intensity vs. wavelength of tested device A.
Figure 12:
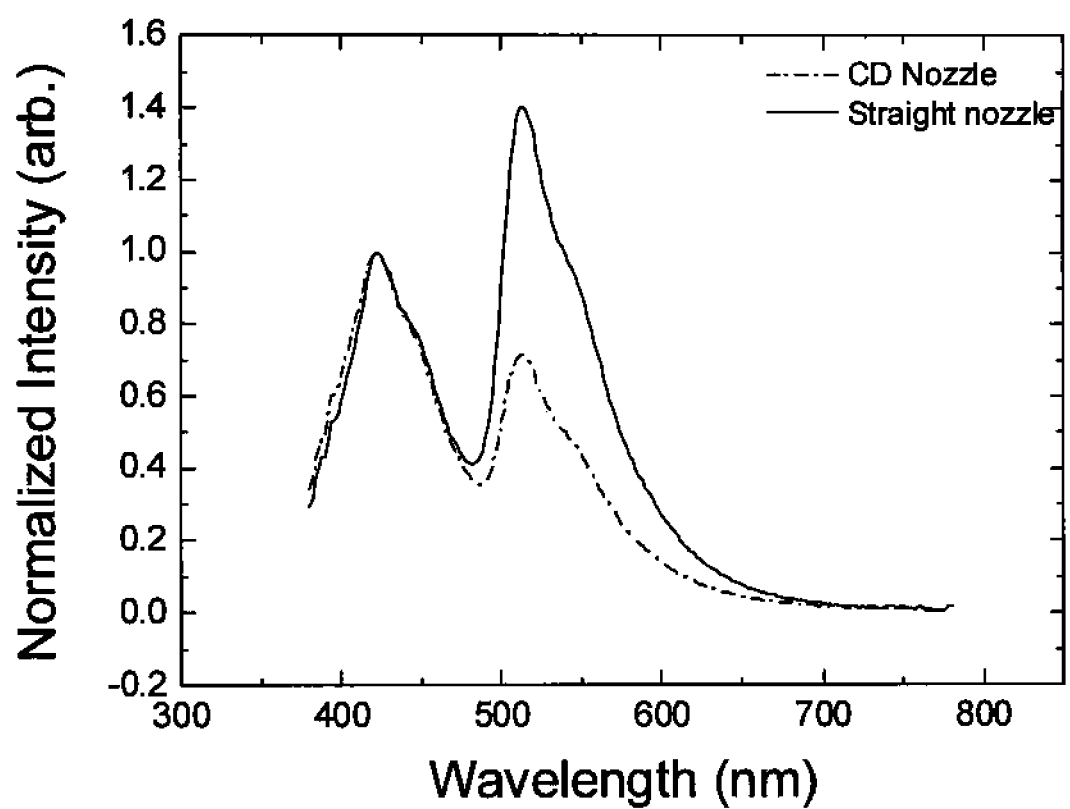
FIG. 12 shows a plot of normalized emission intensity vs. wavelength of tested devices C.
Figure 13:
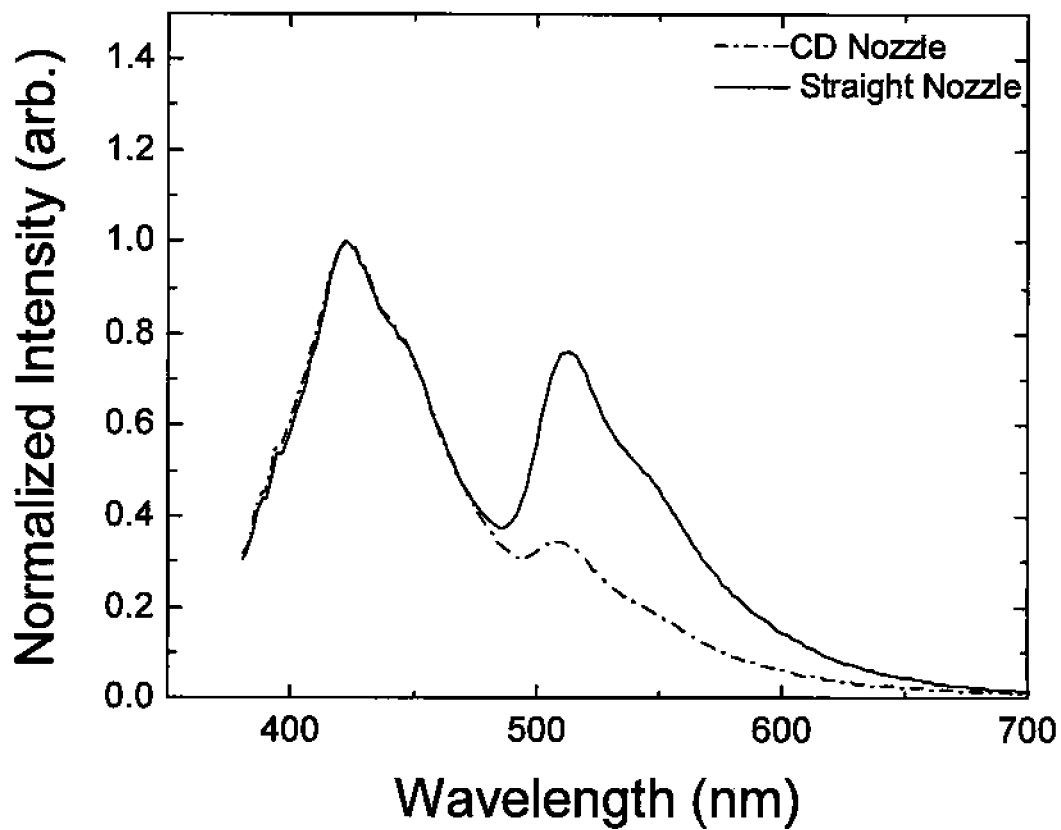
FIG. 13 shows a plot of normalized emission intensity vs. wavelength of tested devices D.

The invention has been demonstrated using an example design of a converging-diverging OVJP nozzle shown in FIG. 9. Devices made using a straight nozzle were also tested for comparison. FIG. 10 shows additional details of a nozzle tip according to aspects of the invention, similar to the nozzle of FIG. 9. As seen in FIG. 10, the nozzle has an throttle portion with a diameter of approximately 0.01 inches (0.25 mm) drilled in the body of the nozzle, leading to an outlet of approximately 0.039 inches (1.0 mm) diameter. This is similar to the nozzle design shown in FIG. 4, an corresponds to an A1/A2 ratio of 16. The exemplary inventive nozzle included an L2 of approximately 0.1 inches (2.5 mm), and an L1 of approximately 0.35 inches (8.9 mm).

Four emitting devices A-D were fabricated on a glass substrate. The glass substrate was patterned with 2.4 mm wide ITO pads for devices A-D, with 0.5 mm ITO-ITO spacing between the pads for deposition. A hole injection layer (HIL) was VTE deposited on ITO anode followed by a hole transporting TCTA layer (HTL). 30 Å of neat green dopant (Dopant 1) was then OVJP printed on the center of one of the ITO pads corresponding to device B. This was done using the exemplary inventive nozzle in one test case, and with a comparative straight nozzle in another test case. Subsequent layers, namely electron transporting BCP layer (ETL), electron injecting LiF, were deposited over devices A-D. The devices were then completed by depositing the Aluminum cathode.

The device is highly asymmetric in charge injection and transport characteristics so that all the excitons generated are tightly confined at the TCTA/BCP interface. In the absence of contamination, the resulting devices show blue EL from TCTA. The deposited line on device B shows green electroluminescence because of efficient exciton transfer to the green dye. Any overspray of green dye beyond the deposited ITO stripe on device B will show some level of green emission depending on the amount of green dye deposited at that location. Peaks in the electroluminescence spectrum due to the green dye and the default TCTA emission are clearly separable and the ratio of the green and blue peaks quantitatively defines the amount of green dye present. Because of the efficient confinement of excitons at the interface and the high efficiency of downhill energy transfer, the structures are very sensitive to the presence of overspray, having been used to detect <0.5 Å of material, or about ⅕ of a monolayer. The emission spectra are measured at the center of the 2.4 mm wide pixel. Devices A and C are located at 2.9 mm away from center of the printed line in device B. Device D is located at a distance of 5.8 mm from the center of the printed line in device B.

The normalized emission intensity vs. wavelength of the devices A, C and D are shown in FIGS. 6, 7 and 8, respectively. With the use of the exemplary inventive nozzle, the overspray is shown to be reduced in all the three devices. In the pixels of devices A and C, TCTA blue emission dominates when the inventive nozzle is used to print while the green dye emission dominates when a straight nozzle is used. It is to be noted that the emission profile of device A with the straight nozzle corresponds to an overspray <1.6% or 0.5 Å green contamination. This suggests that the overspray with the exemplary inventive nozzle is far lesser than <1.6% and cannot be quantified. Similarly a drastic reduction in overspray is seen in the pixel of device D.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method of depositing an organic material, comprising:
introducing a vapor including the organic material into a nozzle via an inlet;
ejecting the vapor from an outlet at a distal end of the nozzle, the outlet having a cross sectional area A1;
after the ejecting, depositing the organic material on a substrate to form at least part of an organic emitting or detecting area,
wherein, the vapor is passed through a portion of the nozzle between the inlet and the outlet at an axial distance L1 from the outlet, the portion of the nozzle having a cross sectional area A2,
wherein A1/A2 is approximately 16, or A1 is approximately 0.6-1.2 mm² and A2 is approximately 0.04-0.1 mm², or both, and
wherein a width of the deposited organic material is substantially equal to a width of the outlet.

2. The method of claim 1, wherein the organic material is deposited without the use of a shadow mask.

3. The method of claim 1, wherein a shock front of the vapor is formed downstream of the vapor passing through said portion of the nozzle and substantially dissipates prior to the outlet.

4. The method of claim 1, wherein the outlet has a radius R1 and the portion of the nozzle has a radius R2, and L1/R2 is in a range of approximately 3 to 200.

5. The method of claim 4, wherein L1/R2 is in a range of approximately 5 to 20.

6. The method of claim 4, wherein R1/R2 is in a range of approximately 4 to 100.

7. The method of claim 1, wherein the nozzle is included in a nozzle block with a plurality of similar nozzles, each of the plurality of nozzles configured to deposit an organic emitting material.

8. The method of claim 1, wherein the vapor is formed into a collimated beam downstream of said portion of the nozzle and upstream of said outlet.

9. A method of depositing an organic material, comprising:
introducing a vapor including the organic material into a nozzle via an inlet;
ejecting the vapor from an outlet at a distal end of the nozzle, the outlet having a cross sectional area A1 and a diameter D1;
after the ejecting, depositing the organic material on a substrate to form at least part of an organic emitting or detecting area,
wherein, the vapor is passed through a portion of the nozzle between the inlet and the outlet at an axial distance L1 from the outlet, the portion of the nozzle having a cross sectional area A2 and a diameter D2,
wherein L1/D2 is greater than 2;
wherein A1/A2 is approximately 16, or A1 is approximately 0.6-1.2 mm² and A2 is approximately 0.04-0.1 mm², or both, and
wherein a width of the deposited organic material is substantially equal to a width of the outlet.

10. The method of claim 9, wherein a shock front of the vapor is formed downstream of the vapor passing through said portion of the nozzle and substantially dissipates prior to the outlet.

11. The method of claim 9, L1/D2 is in a range of approximately 2 to 200.

12. The method of claim 9, wherein L1/D2 is in a range of approximately 2 to 20.

13. The method of claim 9, wherein L1/D2 is approximately 3.

14. The method of claim 9, wherein D1/D2 is in a range of approximately 4 to 100.

15. The method of claim 9, wherein the nozzle is included in a nozzle block with a plurality of similar nozzles, each of the plurality of nozzles configured to deposit an organic emitting material.

16. The method of claim 9, wherein the vapor is formed into a collimated beam downstream of said portion of the nozzle and upstream of said outlet.

* * * * *